United States Patent [19]

Imanishi

[11] Patent Number: 4,929,908

[45] Date of Patent: May 29, 1990

[54] GAIN CONTROLLABLE AMPLIFIER CIRCUIT

[75] Inventor: Kazuo Imanishi, Yokohama, Japan

[73] Assignee: Kubushiki Kaisha Toshiba, Kawasaki, Japan

[21] Appl. No.: 344,775

[22] Filed: Apr. 28, 1989

[30] Foreign Application Priority Data

May 2, 1988 [JP] Japan ................. 63-109313

[51] Int. Cl.$^5$ .................... H03F 3/45; H03G 3/30
[52] U.S. Cl. .................... 330/254; 330/85
[58] Field of Search ............. 330/85, 254, 278, 282, 330/285

[56] References Cited

U.S. PATENT DOCUMENTS 3,452,289  6/1969  Ryan ..................... 330/254
4,396,891  8/1983  Johansson et al. ......... 330/260 X

FOREIGN PATENT DOCUMENTS 41012    3/1980  Japan .................... 330/254
183514  10/1984  Japan .................... 330/254

Primary Examiner—James B. Mullins
Attorney, Agent, or Firm—Finnegan, Henderson, Farabow, Garrett and Dunner

[57] ABSTRACT

An amplifier circuit comprises an amplifying section for amplifying an input signal voltage, and feedback resistances for supplying part of an output voltage of the amplifying section as a negative feedback signal voltage thereto. The amplifying section of the amplifier circuit includes a first voltage-current converting amplifier for converting an input signal voltage into a corresponding current, a second voltage-current converting amplifier for converting a negative feedback signal voltage into a corresponding current, an active load circuit for coupling output currents of the first and second voltage-current converting amplifier, which are set in an opposite phase relation, and for generating an output voltage corresponding to the sum of the coupled currents, a voltage amplifier for amplifying the output voltage of the active load circuit, and a control circuit for controlling the ratio of the mutual conductances of the first and second voltage-current converting amplifiers.

10 Claims, 2 Drawing Sheets

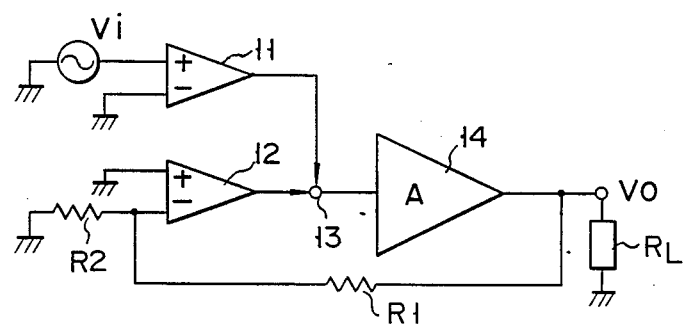
F I G. 3

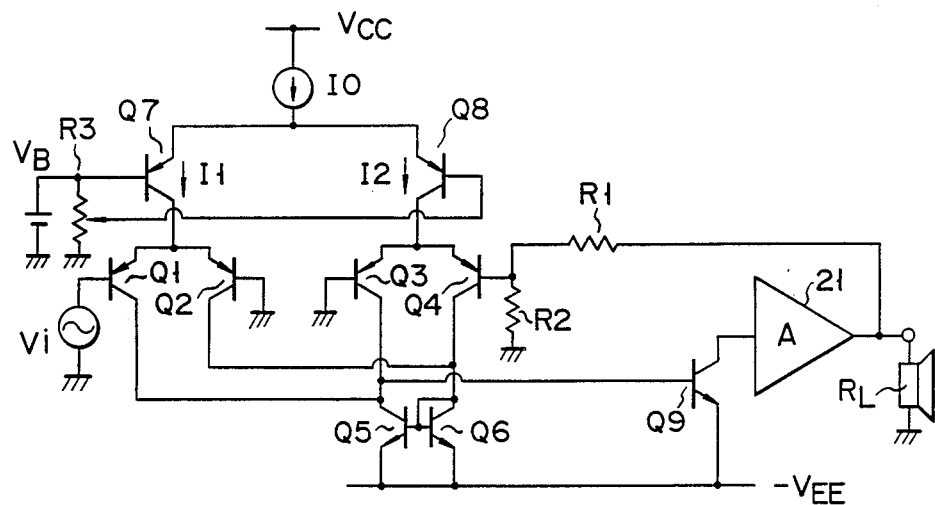
F I G. 4
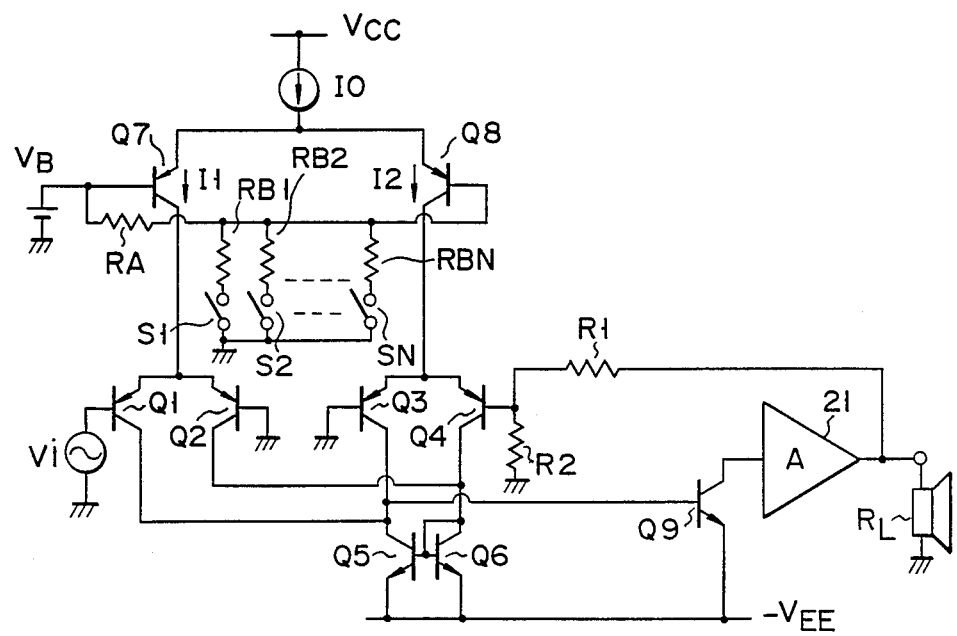
F I G. 5

GAIN CONTROLLABLE AMPLIFIER CIRCUIT

BACKGROUND OF THE INVENTION

1. Field of the Invention

This invention relates to a negative feedback type amplifier circuit, and more particularly to an audio amplifier circuit.

2. Description of the Related Art

FIG. 1 shows the construction of the conventional amplifier circuit used in an electronic device such as a radio receiver or a tape recorder. Stereo audio signals generated from signal source 1 are amplified by means of pre-amplifier 2 and then supplied to power amplifier 4 via variable resistor 3. Power amplifier 4 amplifies the audio signals and then drives audio speakers 5 according to the amplified audio signals. Variable resistor 3 is used to adjust the sound volume of speakers 5 and functions to determine the ratio of an input voltage of power amplifier 4 to an output voltage of pre-amplifier 2.

In a case where the audio signal is supplied to power amplifier 4 via variable resistor 3 as in the above amplifier circuit, power amplifier 4 will amplify the audio signal together with noise generated by the mechanical operation of the variable resistor. The quality of each variable resistor will be degraded as the duration of service becomes longer. Therefore, it becomes necessary to use the variable resistor of high quality.

In recent years, an amplifier circuit which does not require such a high quality variable resistor is proposed. The construction of the amplifier circuit is shown in FIG. 2. In the amplifier circuit, a set of variable resistors in FIG. 1 are replaced by electronic volume 6. Electronic volume 6 sets the rate of an input voltage of power amplifier 4 to an output voltage of pre-amplifier 2 according to the voltage level of control voltage source 7. The voltage level of control voltage source 7 is changed to adjust the volume of speakers 5. In this case, control voltage source 7 does not form a signal path for the audio signal. Therefore, when the the voltage level of control voltage source 7 is changed by use of an ordinary variable resistor, noise generated by operation of the variable resistor can be prevented from being amplified by means of power amplifier 4. Further, in this amplifier, it is possible to use a single variable resistor in order to adjust both speakers 5 in the same manner or use a remote-controlled switching element in order to change the voltage level of control voltage source 7.

An effort has been made to lower the manufacturing cost and enhance the reliability of the above electronic device by use of IC technology. If electronic volume 6 is independently formed in an IC configuration, the number of parts used increases, making the manufacturing cost high. In order to avoid the increase in the number of parts used, electronic volume 6 is normally incorporated into the IC of power amplifier 4. In this case, since electronic volume 6 and power amplifier 4 are formed in the D.C. direct coupled configuration, compensation for D.C. offset becomes necessary and the linearity of amplification of the power amplifier must be taken into consideration. Therefore, electronic volume 6 becomes complex in construction, making the IC cost high.

SUMMARY OF THE INVENTION

An object of this invention is to provide an amplifier circuit capable of attaining a highly reliable volume adjustment without increasing the manufacturing cost.

The above object can be attained by an amplifier circuit comprising a first voltage-current converter for converting an input signal voltage into a corresponding current; a second voltage-current converter for converting a negative feedback signal voltage into a corresponding current; a coupling section for coupling output currents of the first and second voltage-current converters which are set in the opposite phase relation and generating an output voltage corresponding to the sum of the coupled currents; a voltage amplifier for amplifying the output voltage of the coupling section; a feedback section for supplying the output voltage of the voltage amplifier as a negative feedback signal to the second voltage-current converter; and a control section for controlling the ratio of the mutual conductances of the first and second voltage-current converters.

With the above amplifier circuit, the ratio of the mutual conductances of the first and second voltagecurrent converters are controlled by the control section. The gain of the amplifier circuit is determined by the ratio of the mutual conductances, and therefore the control section can be used for adjusting the volume of an audio device, for example. Even if the control section is constructed by a normal variable resistor, noise generated by operation of the variable resistor will not be amplified since the control section is independent from the signal path for the input signal. Further, with the above construction, it is not necessary to take the compensation for the D.C. offset into consideration. Thus, it becomes possible to attain a highly reliable volume control operation without increasing the manufacturing cost.

BRIEF DESCRIPTION OF THE DRAWINGS

FIG. 3 is a circuit diagram schematically showing an amplifier circuit according to one embodiment of this invention;

FIG. 4 is a circuit diagram showing the amplifier circuit of FIG. 3 in detail; and FIG. 5 is a circuit diagram showing a modification of the amplifier circuit of FIG. 4.

DETAILED DESCRIPTION OF THE PREFERRED EMBODIMENTS

Figure 1:
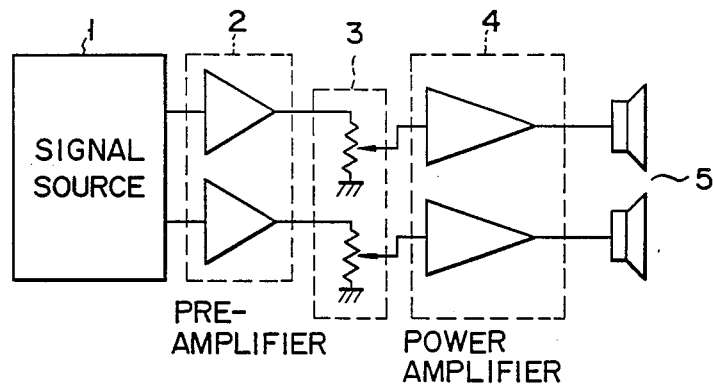
FIG. 1 shows the construction of the conventional amplifier circuit.
Figure 2:
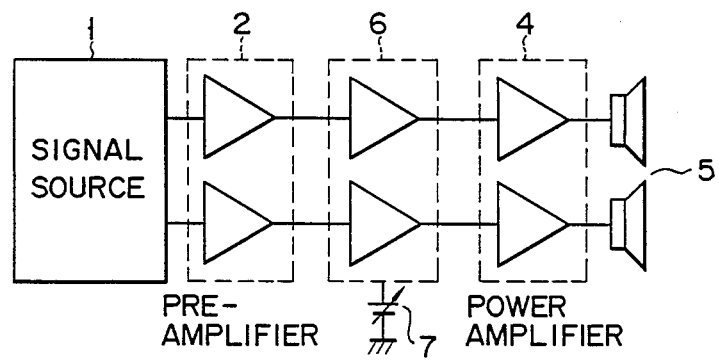
FIG. 2 shows the construction of the conventional amplifier circuit in which a variable resistor in FIG. 1 is replaced by an electronic volume.

There will now be described an amplifier circuit according to one embodiment of this invention with reference to FIGS. 3 and 4. FIG. 3 is a circuit diagram schematically showing the construction of the amplifier circuit. The amplifier circuit includes voltage-current converting amplifier 11 having mutual conductance $g_{m1}$ (input voltage/output current), voltage-current converting amplifier 12 having mutual conductance $g_{m2}$, adder 13, voltage amplifier 14 having current gain A and constituting an output section, resistors $R_1$ and $R_2$ determining the feedback factor, and load $R_L$. The voltage gain of the amplifier circuit is expressed as follows:

$$v_0 = \left( v_i \cdot g_{m1} - v_0 \cdot \frac{R_2}{R_1 + R_2} \cdot g_{m2} \right) A \cdot R_L \quad (1)$$

Equation (1) can be re-written as follows by replacing feedback factor ($R_1/R_1+R_2$) by F:

$$\frac{v_0 (1 + F \cdot g_{m2} \cdot A \cdot R_L) = v_i g_{m1} \cdot A \cdot R_L}{v_i} = \frac{g_{m1} \cdot A \cdot R_L}{1 + F \cdot g_{m2} \cdot A \cdot R_L} = \frac{1}{\frac{1}{g_{m1} \cdot A \cdot R_L} + F \frac{g_{m2}}{g_{m1}}} \quad (2)$$

If gain $g_{m1} \cdot A \cdot R_L$ is extremely large, that is, $1 << g_{m1} \cdot A \cdot R_L$, gain G (the voltage gain of the output of amplifier 14 with respect to input vi) is expressed as follows:

$$G = \frac{v_0}{v_i} = \frac{1}{F \cdot \frac{g_{m2}}{g_{m1}}} = \frac{1}{F} \cdot \frac{g_{m1}}{g_{m2}} \quad (3)$$

Therefore, when $g_{m1}=g_{m2}$, G is 1/f, that is, the ratio of the feedback resistances, when $g_{m1}<g_{m2}$, G decreases, and when $g_{m1}>g_{m2}$, G increases.

FIG. 4 shows the detail circuit construction of the amplifier circuit according to the embodiment of this invention. In FIG. 4, transistors $Q_1$ and $Q_2$ constitute voltage-current converting amplifier 11 for amplifying input signal $v_i$, and transistors $Q_3$ and $Q_4$ constitute voltage-current converting amplifier 12 for amplifying a negative feedback signal fed back from output terminal $V_0$. Further, transistors $Q_5$ and $Q_6$ serve as an active load which couples or adds output currents of amplifiers 11 and 12 together in an inverted relation. An output voltage corresponding to the added currents is supplied to amplification transistor $Q_9$, and an output voltage of transistor $Q_9$ is further amplified by means of amplifier 21. In FIG. 4, $I_0$ denotes a constant current source and $V_B$ denotes a bias voltage source. Further, transistors $Q_7$ and $Q_8$ in which currents $I_1$ and $I_2$ flow constitute a current source for setting the bias point of transistors $Q_3$ and $Q_4$. Mutual conductance $g_{m1}$ of amplifier 11 constituted by transistors $Q_1$ and $Q_2$ is expressed by the following equation:

$$g_{m1} = \frac{I_{1/2}}{V_T} = \frac{I_1}{2V_T}, \quad V_T = \frac{kT}{q} \quad$$

where $V_T=kT/q$, k is a Bolzmann's constant, T is an absolute temperature, and q is the charge amount of an electron. Likewise, mutual conductance $g_{m2}$ of amplifier 12 constituted by transistors $Q_3$ and $Q_4$ is expressed by the following equation:

$$g_{m2} = \frac{I_{2/2}}{V_T} = \frac{I_2}{2V_T}$$

Thus, gain G in this embodiment can be obtained by substituting $g_{m1}$ and $g_{m2}$ into equation (3) as follows:

$$G = \frac{v_0}{v_i} = \frac{R_2 + R_1}{R_1} \cdot \frac{g_{m1}}{g_{m2}} = \frac{R_2 + R_1}{R_1}. \quad (4)$$

-continued
$$\frac{I_1 \cdot 2V_T}{2V_T \cdot I_2} = \frac{I_1}{I_2} \cdot \frac{R_2 + R_1}{R_1}$$

When the bias voltage applied to the bases of transistors $Q_7$ and $Q_8$ constituting a differential amplifier is changed by operating variable resistor $R_3$, the ratio of currents $I_1$ and $I_2$ is changed. Gain G is determined by the ratio of currents $I_1$ and $I_2$.

As described above, in this embodiment, gain G can be determined by the ratio of currents ($I_1:I_2$), and the satisfactory linearity of variation in the gain can be obtained by adequately controlling the ratio of $I_1/I_2$ as shown by equation (4). Further, since it is not necessary to connect an electronic volume circuit, no problem concerning the D.C. offset occurs.

This invention is not limited to the above embodiment, but can be variously modified without departing from the technical scope thereof. For example, variable resistor $R_3$ can be replaced by a plurality of switches S1-SN and fixed resistors RB1-RBN connected thereto, and fixed resistor RA as shown in FIG. 5. Each of the fixed resistors RB1-RBN has a common resistance. In this case, it is possible to change gain G at a constant rate by increasing or decreasing the number of switches S1-SN in the conductive state.

What is claimed is:

1. An amplifier circuit comprising:
   first voltage-current converter means for converting an input signal voltage into a corresponding first output current;
   second voltage-current converter means for converting a negative feedback signal voltage into a corresponding second output current, said second voltage-current converter having first and second input terminals to which a DC voltage of a predetermined level and the negative feedback signal voltage are applied, respectively;
   coupling means for coupling said first and second output currents of said first and second voltage-current converter means, and for generating an output voltage corresponding to the sum of said first and second output currents;
   voltage amplifier means for applying the output voltage of said coupling means;
   feedback means for supplying part of the output voltage of said voltage amplifier means as the negative feedback signal voltage only to the second inputs terminal of said second voltagecurrent converter means, the DC voltage level of the output voltage of said voltage amplifier means being determined in accordance with both the negative feedback signal voltage supplied from said feedback means and the DC voltage of the predetermined level; and
   control means for controlling the ratio of the mutual conductances of said first and second voltage-current converter means.

2. An amplifier circuit according to claim 1, wherein said control means includes a current supply circuit for supplying first and second drive currents to said first and second voltage-current converter means, respectively and a control circuit for controlling the ratio of the first and second drive currents.

3. An amplifier circuit according to claim 2, wherein said control circuit includes a constant voltage source and variable resistor means for dividing the output voltage of said constant voltage source, and wherein said current supply circuit includes a constant current source and a differential amplifying circuit having first and second transistors each connected to said constant current source and biased by the respective output voltages of said constant voltage source and said variable resistor means.

4. An amplifier circuit according to claim 3, wherein said variable resistor means includes a first fixed resistor connected at one end to one end of said constant voltage source, a plurality of second fixed resistors, and connecting means for selectively connecting said second fixed resistors between the other ends of said first fixed resistor and said constant voltage source.

5. An amplifier circuit according to claim 4, wherein said connecting means includes a plurality of switching means each connected in series with a corresponding second fixed resistor between the other ends of said first fixed resistor and said constant voltage source.

6. An amplifier circuit according to claim 5, wherein each of said second fixed resistors has a common resistance.

7. An amplifier circuit according to claim 1, wherein said second voltage-current converter means includes a differential amplifier comprising a pair of transistors and having first and second input terminals corresponding to said first and second input terminals of said second voltage-current converter, respectively, and wherein the DC voltage of the predetermined level is applied to the first input terminal of said differential amplifier, and the feedback signal voltage is applied by said feedback means from said voltage amplifier means to the second input terminal of said differential amplifier.

8. An amplifier circuit according to claim 7, wherein said control means includes:
   a current supply circuit for supplying first and second drive currents to said first voltage-current converter means and said differential amplifier; and
   a control circuit for controlling the ratio of the first and second drive currents.

9. An amplifier circuit according to claim 8, wherein said differential amplifier includes:
   a first transistor having an emitter connected to said current supply circuit to receive said second drive current, a collector connected to said coupling means, and a base to which the DC voltage of the predetermined level is applied; and
   a second transistor having an emitter which is commonly connected to the emitter of said first transistor, a collector connected to said coupling means, and a base to which said feedback signal voltage is applied.

10. An amplifier circuit according to claim 9, wherein the DC voltage of the predetermined level, applied to the base of said first transistor, is equal to the ground level.

* * * * *